(12) United States Patent
Konishi (10) Patent No.: US 6,219,272 B1
(45) Date of Patent: Apr. 17, 2001

(54) SEMICONDUCTOR RANDOM ACCESS MEMORY

(75) Inventor: Masayuki Konishi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/580,208

(22) Filed: May 26, 2000

(30) Foreign Application Priority Data

Dec. 9, 1999 (JP) .................................................. 11-350748

(51) Int. Cl.$^7$ .................................................. G11C 11/00

(52) U.S. Cl. ........................... 365/154; 365/156; 365/203

(58) Field of Search .................................... 365/154, 156, 365/203

(56) References Cited

U.S. PATENT DOCUMENTS

| | | | | |
|---|---|---|---|---|
| 6,091,629 | * | 7/2000 | Osada et al. .......................... | 365/156 |
| 6,108,262 | * | 8/2000 | Itoh et al. ............................. | 365/229 |
| 6,137,715 | * | 10/2000 | Cho ...................................... | 365/156 |

FOREIGN PATENT DOCUMENTS 8-7574  1/1996  (JP) .

* cited by examiner

Primary Examiner—David Nelms
Assistant Examiner—Gene N. Auduong
(74) Attorney, Agent, or Firm—Burns, Doane, Swecker & Mathis, LLP

(57) ABSTRACT

Memory cells are arranged in a matrix of rows and columns, first and second bit lines charged are arranged in the columns, a first transistor (or a second transistor) is arranged between each memory cell and one first bit line (or one second bit line) of the same column, and a third transistor connected with one first transistor and one second transistor is arranged for each memory cell. When data stored in a particular memory cell of particular column and row is read out, a column selection signal is transmitted to third transistors of the particular column to turn on the third transistors, a row selection signal is transmitted to third transistors of the particular row, so that the row selection signal is transmitted to first and second transistors of the particular row and column through the third transistor of the particular row and column to turn on the first and second transistors and to electrically connect the particular memory cell with particular first and second bit lines of the particular column. Therefore, one of the particular first and second bit lines discharges a charge, and the data is obtained by detecting levels of the particular first and second bit lines. Accordingly, because only one bit line discharges the charge, a consumed electric power can be saved.

3 Claims, 7 Drawing Sheets

SEMICONDUCTOR RANDOM ACCESS MEMORY

BACKGROUND OF THE INVENTION

1. Field of the Invention

The present invention relates to a semiconductor apparatus, and more particularly to a semiconductor random access memory in which bit lines are pre-charged to access to one of a plurality of memory cells and are discharged in a data outputting operation.

2. Description of Related Art

Figure 6:
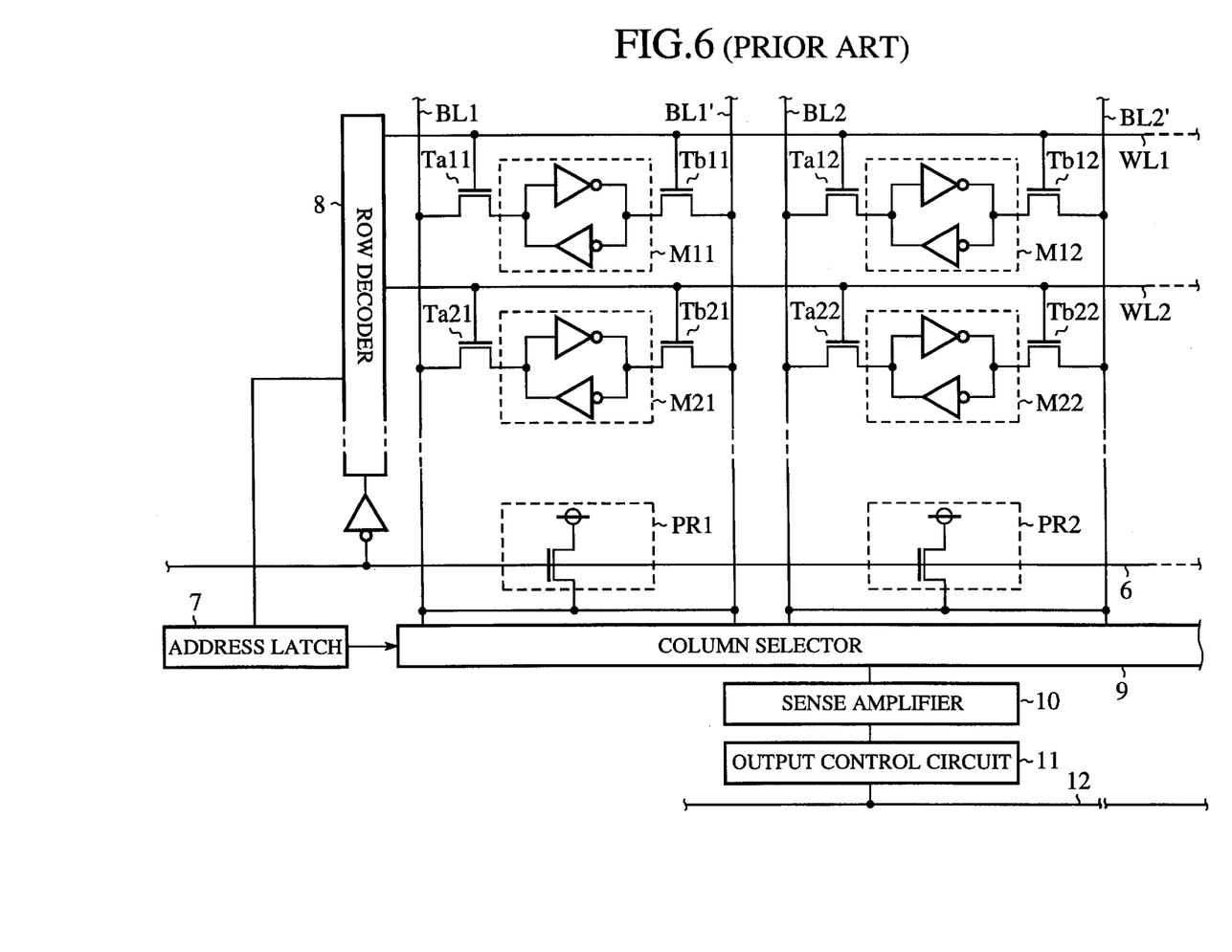
FIG. 6 is a circuit view showing a configuration of a conventional semiconductor random access memory.

FIG. 6 is a circuit view showing a configuration of a conventional semiconductor random access memory.

As shown in FIG. 6, symbols $M_{mn}$ (m=1,2,3,...,M, and n=1,2,3,...,N) denote a plurality of memory cells arranged in a matrix shape (M rows and N columns), and high level data (called "H" data) or low level data (called "L" data) is stored in each of the memory cells $M_{mn}$. Symbols $BL_n$ denote a plurality of bit lines arranged in parallel to each other in the columns in one-to-one correspondence. Each of the bit lines $BL_n$ is set to a high ("H") level in a pre-charge operation, and each bit line $BL_n$ is maintained to the "H" level or is changed to a low ("L") level in a reading operation and a writing operation. Symbols $BL_n'$ denote a plurality of bit lines arranged in parallel to each other in the columns in one-to-one correspondence so as to make one pair of bit lines $BL_n$ and $BL_n'$ for each column. Each of the bit lines $BL_n'$ is set to the "H" level in the pre-charge operation, and each of the bit lines $BL_n'$ is changed or maintained to the "L" or "H" level opposite to the level of the corresponding bit line $BL_n$ in the reading operation and the writing operation. Symbols $WL_m$ denote a plurality of word lines arranged in parallel to each other in the rows in one-to-one correspondence and crossing over the bit lines $BL_n$ and $BL_n'$. Each of the word lines $WL_m$ transmits a row selection signal set to the "H" level in the reading operation and the writing operation. Symbols $T_{amn}$ denote a plurality of first n-channel transistors (functioning as first transistors) in which each gate electrode is connected to the corresponding word line $WL_m$. Each of the first n-channel transistors $T_{amn}$ connects electrically the bit line $BL_n$ with a first side of the memory cell $M_{mn}$ to equalize the electric level of the bit line $BL_n$ with that of the first side of the memory cell $M_{mn}$ in cases where the row selection signal transmitting through the corresponding word line $WL_m$ is input to the gate electrode. $T_{bmn}$ denotes a plurality of second n-channel transistors (functioning as second transistors) in which each gate electrode is connected to the corresponding word line $WL_m$. Each of the second n-channel transistors $T_{bmn}$ connects electrically the bit line $BL_n'$ with a second side of the memory cell $M_{mn}$ to equalize the electric level of the bit line $BL_n'$ with that of the second side of the memory cell $M_{mn}$ in cases where the row selection signal transmitting through the corresponding word line $WL_m$ is input to the gate electrode. A reference numeral 6 denotes a pre-charge control signal line. The pre-charge control signal line 6 transmits a pre-charge control signal indicating a time-period of the pre-charge operation for each cycle.

Symbols $PR_n$ denote a plurality of pre-charge circuits. Each of the pre-charge circuits $PR_n$ pre-charges the corresponding pair of bit lines $BL_n$ and $BL_n'$ during the time-period of the pre-charge operation indicated by the pre-charge control signal transmitting through the pre-charge control signal line 6 to set the electric levels of the bit lines $BL_n$ and $BL_n'$ to the "H" level.

A reference numeral 7 denotes an address latch. The address latch 7 receives an address signal, which indicates an address (i,j) of a particular memory cell $M_{ij}$ to be accessed, from a central processing unit (not shown) or the like a-nd holds address data indicating a particular row and a particular column as the address (i,j) of the particular memory cell $M_{ij}$. A reference numeral 8 denotes a row decoder. The row decoder 8 decodes the address data of the particular memory cell $M_{ij}$ held in the address latch 7 to specify the particular row and to heighten the electric level of a particular word line $W_i$ corresponding to the particular row of the particular memory cell $M_{ij}$ to the "H" level in the reading operation. The first n-channel transistor $T_{aij}$ and the second n-channel transistor $T_{bij}$ corresponding to the particular memory cell $M_{ij}$ are turned on, and the electric levels of a particular pair of bit lines $BL_j$ and $BL_j'$ are equalized with those of the sides of the particular memory cell $M_{ij}$.

Figure 7:
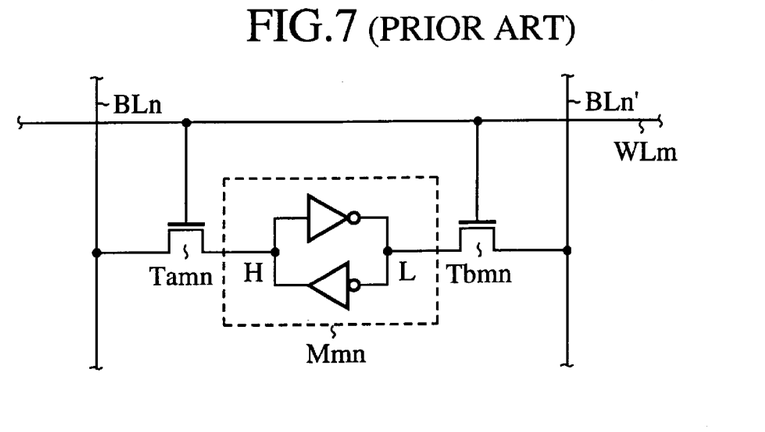
FIG. 7 is a circuit view showing a configuration of each memory cell arranged in the conventional semiconductor random access memory shown in FIG. 6.

A reference numeral 9 denotes a column selector. The column selector 9 selects the particular pair of bit lines $BL_j$ and $BL_j'$ according to the address data held in the address latch 7. A reference numeral 10 denotes a sense amplifier. The sense amplifier 10 detects a pair of electric levels of the particular pair of bit lines $BL_j$ and $BL_j'$ selected in the column selector 9. A reference numeral 11 denotes an output control circuit. The output control circuit 11 performs an output control for the pair of electric levels of the particular pair of bit lines $BL_j$ and $BL_j'$ detected in the sense amplifier 10. A reference numeral 12 denotes a data bus. The data bus 12 transmits the pair of electric levels, which are output-controlled in the output control circuit 11 and indicate the "H" data or the "L" data stored in the particular memory cell $M_{ij}$, to an external apparatus. FIG. 7 is a circuit view showing a configuration of each memory cell $M_{mn}$.

Each memory cell $M_{mn}$ is a latch circuit which is composed of a pair of inverters directed to different directions in parallel to each other to set electric levels of the first and second sides of the memory cell $M_{mn}$ to different levels. In cases where the "H" data (or the "L" data) is stored in the memory cell $M_{mn}$, the first side of the memory cell $M_{mn}$ facing on the bit line $BL_n$ is set to the "H" level (or "L" level), and the second side of the memory cell $M_{mn}$ facing on the bit line $BL_n'$ is set to the "L" level (or "H" level).

In the above configuration, an operation of the conventional SRAM is described with reference to FIG. 8.

Figure 8:
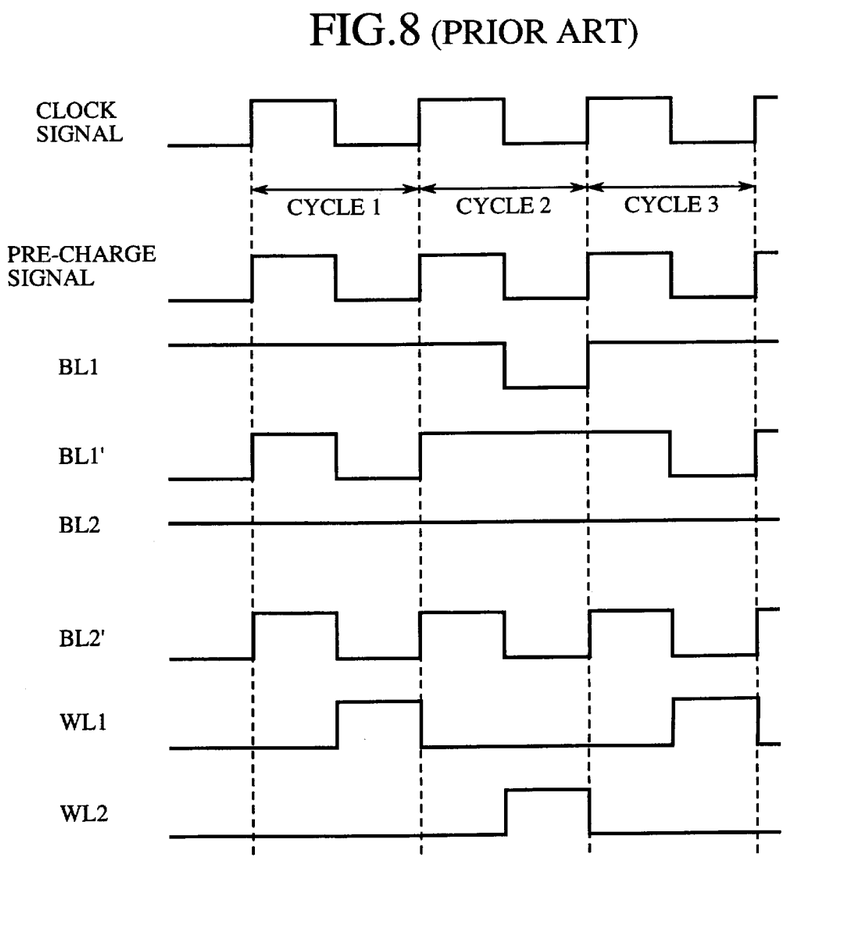
FIG. 8 shows the relationship of electric levels ("H" and "L" levels) of a plurality of signals and lines of the conventional semiconductor random access memory shown in FIG. 6 in cases where data of the memory cells $M_{11}$, $M_{21}$ and $M_{12}$ are read out in that order.

FIG. 8 shows the relationship of electric levels ("H" and "L" levels) of a plurality of signals and lines of the conventional SRAM.

In this operation, the "H" data stored in the memory cell $M_{11}$, the "L" data stored in the memory cell $M_{21}$ and the "H" data stored in the memory cell $M_{12}$ are, for example, read out in that order.

As shown in FIG. 8, the "H" data of the memory cell $M_{11}$ is read out in a first cycle, the "L" data of the memory cell $M_{21}$ is read out in a second cycle, and the "H" data of the memory cell$M_{12}$ is readout in a third cycle. In detail, a pre-charge operation is performed in the first half of the first cycle by using the pre-charge circuits $PR_n$ to set all bit lines $BL_n$ and $BL_n'$ to the "H" level. Thereafter, in the second half of the first cycle, address data, which indicates an address (1,1) of the memory cell $M_{11}$ and is held in the address latch 7, is decoded in the row decoder 8, the word line WL1 corresponding to the memory cell $M_{11}$ is selected according to the decoded data, and the word line WL1 is set to the "H" level by the row decoder 8 to 15 transmit a row selection signal to the memory cells $M_{1n}$. Therefore, the gate electrodes of the first n-channel transistor $T_{a11}$ and the second n-channel transistor $T_{b11}$ are set to the "H" level according to the row selection signal, the first n-channel transistor $T_{a11}$ and the second n-channel transistor $T_{b11}$ are turned on, the first side of the memory cell $M_{11}$ set to the "H" level is electrically connected with the bit line BL1, the second side of the memory cell $M_{11}$ set to the "L" level is electrically connected with the bit line BL1', and the bit line BL1 is maintained to the "H" level because the electric level of the bit line BL1 is the same as that of the first side of the memory cell $M_{11}$. In contrast, because the electric level of the bit line BL1' is higher than that of the second side of the memory cell $M_{11}$, a charge of the bit line BL1' is discharged to the second side of the memory cell $M_{11}$, so that the electric level of the bit line BL1' is changed to the "L" level. Thereafter, the pair of bit lines BL1 and BL1' electrically connected with the memory cell $M_{11}$ are selected by the column selector 9 according to the address data held in the address latch 7, and the pair of bit lines BL1 and BL1' are connected with the sense amplifier 10. In the sense amplifier 10, an electric potential difference between the selected bit lines BL1 and BL1' is detected and amplified, a particular electric level (for example, the "H" level) corresponding to the "H" data stored in the memory cell $M_{11}$ is produced according to the electric potential difference between the selected bit lines BL1 and BL1' and is output to the data bus 12 through the output control circuit 11. Therefore, the "H" data stored in the memory cell $M_{11}$ can be read out to an outer apparatus.

In the second cycle, the pre-charge operation is again performed in the first half of the second cycle to set all bit lines BLn and BLn to the "H" level. That is, the bit line BL1' changed to the "L" level in the second half of the first cycle is charged. Thereafter, in the second half of the second cycle, the word line WL2 corresponding to the memory cell $M_{21}$ is set to the "H" level by the row decoder 8 according to address data indicating an address (2,1), and the first n-channel transistor $T_{a21}$ and the second n-channel transistor $T_{b21}$ are turned on. Therefore, because the "L" data is stored in the memory cell $M_{21}$, a charge of the bit line BL1 is discharged to the first side of the memory cell $M_{21}$, and the electric level of the bit line BL1 is lowered to the "L" level. In contrast, the bit line BL1' is maintained to the "H" level. Thereafter, the pair of bit lines BL1 and BL1' electrically connected with the memory cell $M_{21}$ are selected by the column selector 9 according to the address data, the pair of bit lines BL1 and BL1' are connected with the sense amplifier 10 to detect an electric potential difference between the selected bit lines BL1 and BL1', a particular electric level (for example, the "L" level) corresponding to the "L" data stored in the memory cell $M_{21}$ is produced according to the electric potential difference and is output to the data bus 12 through the output control circuit 11. Therefore, the "L" data stored in the memory cell $M_{21}$ can be read out to the outer apparatus.

In the third cycle, the pre-charge operation is again performed in the first half of the third cycle to set all bit lines BLn and BLn' to the "H" level. That is, the bit line BL1 changed to the "L" level in the second half of the second cycle is charged. Thereafter, in the second half of the third cycle, the word line WL1 corresponding to the memory cell $M_{12}$ is set to the "H" level by the row decoder 8 according to address data indicating an address (1,2), and the first n-channel transistor $T_{a12}$ and the second n-channel transistor $T_{b12}$ are turned on. Therefore, because the "H" data is stored in the memory cell $M_{21}$, the bit line BL2 is maintained to the "H" level, and the electric level of the bit line BL2' is lowered to the "L" level. Thereafter, the pair of bit lines BL2 and BL2' electrically connected with the memory cell $M_{12}$ are selected by the column selector 9 according to the address data, the pair of bit lines BL2 and BL2' are connected with the sense amplifier 10 to detect an electric potential difference between the selected bit lines BL2 and BL2', a particular electric level (for example, the "H" level) corresponding to the "H" data stored in the memory cell $M_{12}$ is produced according to the electric potential difference and is output to the data bus 12 through the output control circuit 11. Therefore, the "H" data stored in the memory cell $M_{12}$ can be read out to the outer apparatus.

However, because the "H" data or the "L" data is stored in each of all the memory cells $M_{mn}$, the electric level of one bit line of each pair of bit lines BLn and BLn' is necessarily lowered to the "L" level each time the reading operation for one memory cell $M_{mn}$ is performed after the pre-charge operation. Therefore, in addition to the charging for one bit line of one pair of bit lines BLj and BLj' corresponding to one particular memory cell $M_{ij}$ to be accessed, a charging for the pairs of bit lines BLn and BLn' except for the pair of bit lines BLj and BLj' is required for each pre-charge operation. For example, in the second half of the first cycle, because the second n-channel transistor $T_{b12}$ are also turned on by the "H" level signal of the word line WL1 to equalize the electric level of the bit line BL2' with the second side of the memory cell $M_{12}$ storing the "H" data, the electric level of the bit line BL2' is lowered to the "L" level as well as that of the bit line BL1', so that it is required in the first half of the second cycle to charge the bit line BL2' in addition to the bit line BL1'. Also, in the same manner, it is required in the first half of a fourth cycle following the third cycle to charge the bit line BL1' in addition to the bit line BL2'.

Particularly, in cases where the number of memory cells is enormously increased because a memory capacity required for the SRAM is increased, there is a probability that an excessive current transmits through the conventional SRAM. Therefore, there are many drawbacks such as the increase of a consumed electric power, the increase of a heat generation, no stabilization in an electric power source, the occurrence of noises and the like.

SUMMARY OF THE INVENTION

To solve the above drawbacks, the object of the present invention is to provide a semiconductor random access memory in which a consumed electric power is suppressed while stably supplying the electric power.

The present invention is achieved by the provision of a semiconductor random access memory comprising:

a plurality of word lines extending in a horizontal direction;

a plurality of pairs of first and second bit lines extending in a vertical direction, each pair of first and second bit lines adjacent to each other respectively having one of two electric levels opposite to each other;

a plurality of memory cells arranged in a matrix shape, each memory cell being arranged in a space partitioned by one pair of first and second bit lines and one word line, a first side and a second side of each memory cell being set to the electric levels opposite to each other;

a first transistor arranged for each memory cell, each first transistor being connected with the first bit line of the corresponding pair of first and second bit lines and the first side of the corresponding memory cell;

a second transistor arranged for each memory cell, each second transistor being connected with the second bit line of the corresponding pair of first and second bit lines and the second side of the corresponding memory cell;

a sub-word line arranged for each memory cell, each sub-word line connecting a gate of the corresponding first transistor and a gate of the corresponding second transistor;

a third transistor arranged for each memory cell, each third transistor connecting the corresponding word line and the corresponding sub-word line; and a data-output-bit selection signal line arranged for each pair of first and second bit lines, each data-output-bit selection signal line being connected with gates of all third transistors which correspond to all memory cells connected with the corresponding pair of first and second bit lines.

In the above configuration, a memory cell to be accessed is only connected with the corresponding pair of first and second bit lines by simultaneously activating the corresponding word line and the corresponding data-output-bit selection signal line, and data stored in the memory cell is read out. Because each of the other memory cells corresponding to the other bit lines connected with the same word line is not connected with the corresponding pair of first and second bit lines, a discharge occurs only in the memory cell to be accessed, so that the electric power supplied to the semiconductor random access memory can be suppressed.

The present invention is achieved by the provision of a semiconductor random access memory comprising: a plurality of word lines extending in a horizontal direction;

a plurality of pairs of first and second bit lines extending in a vertical direction, each pair of first and second bit lines adjacent to each other respectively having one of two electric levels opposite to each other;

a pre-charge control signal line extending in the same direction as that of the word line;

a pre-charge circuit, arranged for each pair of first and second bit lines and connected with the pair of first and second bit lines, for performing a pre-charge of the pair of first and second bit lines;

a pre-charge bit selection signal line, arranged for each pair of first and second bit lines, for transmitting a bit selection signal instructing the pre-charge of the corresponding pair of first and second bit lines; and an AND gate arranged for each pair of first and second bit lines, an input side of each AND gate being connected with the pre-charge control signal line and one pre-charge bit selection signal line relating to the corresponding pair of first and second bit lines, and an output side of each AND gate being connected with the pre-charge circuit relating to the corresponding pair of first and second bit lines.

In the above configuration, when a pre-charge is performed, the pre-charge control signal line and one pre-charge bit selection signal line corresponding to a memory cell to be accessed are simultaneously activated, so that only a pair of first and second bit lines corresponding to the memory cell to be accessed is pre-charged, and each of the other pairs of first and second bit lines is not pre-charged. Therefore, the electric power supplied to the semiconductor random access memory can be suppressed.

It is preferred that the semiconductor random access memory further comprises:

a pre-charge control signal line extending in the same direction as that of the word line;

a pre-charge circuit, arranged for each pair of first and second bit lines and connected with the pair of first and second bit lines, for performing a pre-charge of the pair of first and second bit lines;

a pre-charge bit selection signal line, arranged for each pair of first and second bit lines, for transmitting a bit selection signal instructing the pre-charge of the corresponding pair of first and second bit lines; and an AND gate arranged for each pair of first and second bit lines, an input side of each AND gate being connected with the pre-charge control signal line and one pre-charge bit selection signal line relating to the corresponding pair of first and second bit lines, and an output side of each AND gate being connected with the pre-charge circuit relating to the corresponding pair of first and second bit lines.

In the above configuration, when a pre-charge is performed, the pre-charge control signal line and one pre-charge bit selection signal line corresponding to a memory cell to be accessed are simultaneously activated, so that only a pair of first and second bit lines corresponding to the memory cell to be accessed is pre-charged, and each of the other pairs of first and second bit lines is not pre-charged. Also, a memory cell to be accessed is only connected with the corresponding pair of first and second bit lines by simultaneously activating the corresponding word line and the corresponding data-output-bit selection signal line, and data stored in the memory cell is read out. Because each of the other memory cells corresponding to the other bit lines connected with the same word line is not connected with the corresponding pair of first and second bit lines, a discharge occurs only in the memory cell to be accessed.

Accordingly, the pre-charge and the discharge are performed for the pair of first and second bit lines connected with the memory cell to be accessed, the electric power supplied to the semiconductor random access memory can be suppressed in a data reading-out.

DETAILED DESCRIPTION OF THE PREFERRED EMBODIMENTS

The invention will now be described with reference to the accompanying drawings.

Embodiment 1

Figure 1:
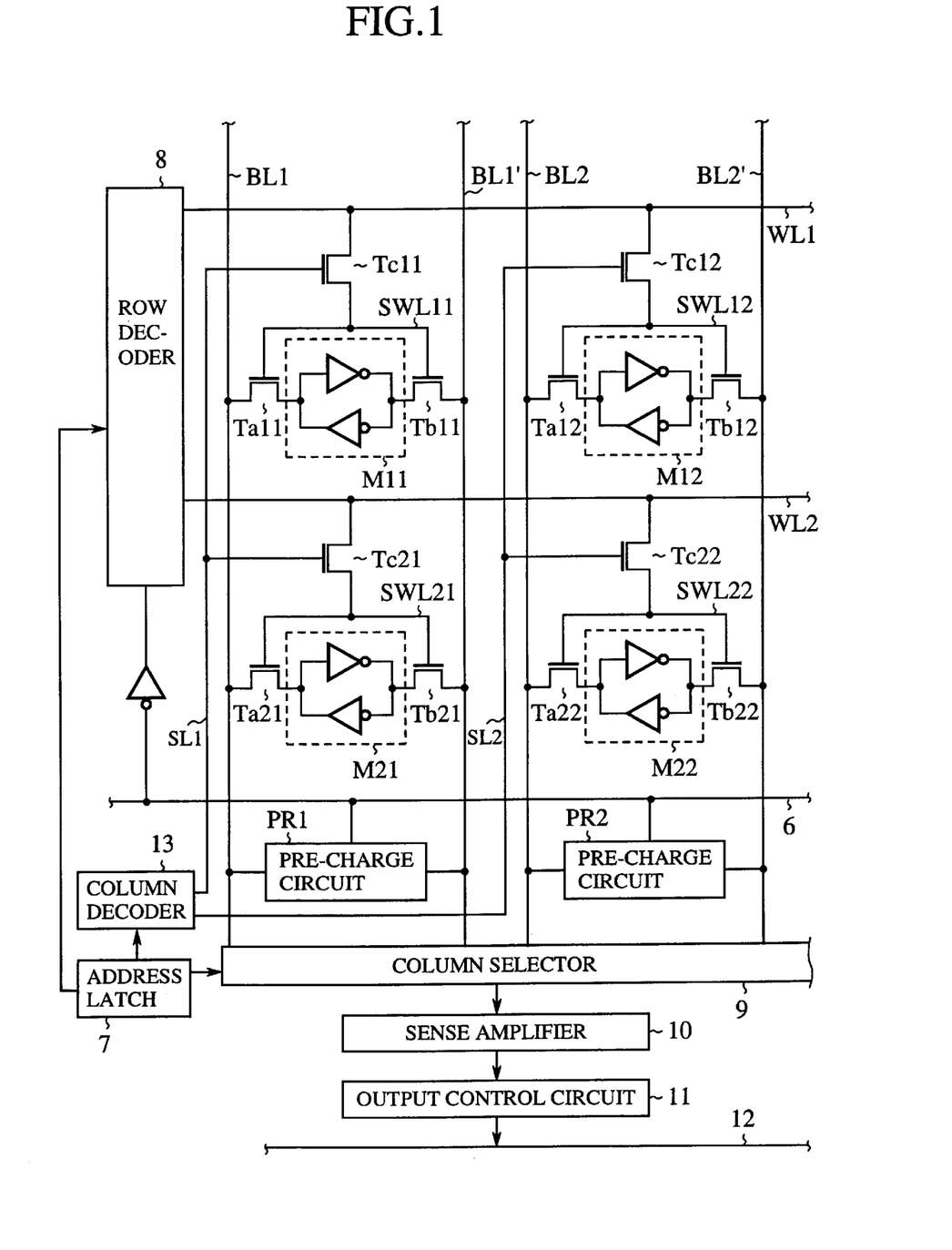
FIG. 1 is a circuit view showing a configuration of a semiconductor random access memory according to a first embodiment of the present invention.

FIG. 1 is a circuit view showing a configuration of a semiconductor random access memory according to a first embodiment of the present invention. The detail description of composing elements indicated by reference numerals, which are the same as those used in FIG. 6, is omitted because the composing elements of FIG. 1 are the same as or equivalent to those of FIG. 6 indicated by the same reference numerals.

As shown in FIG. 1, a semiconductor random access memory comprises the memory cells $M_{mn}$ represented by the memory cells $M_{11}$, $M_{12}$, $M_{21}$ and $M_{22}$, the plurality of pairs of bit lines $BL_n$ and $BL_n'$ represented by the pair of bit lines $BL_1$ and $BL_1'$ and the pair of bit lines $BL_2$ and $BL_2'$, the word lines $WL_m$ represented by $WL_1$ and $WL_2$; the first n-channel transistors (functioning as a gate means) $T_{amn}$ represented by $T_{a11}$, $T_{a21}$, $T_{a12}$ and $T_{a22}$, the second n-channel transistors (functioning as the gate means) $T_{bmn}$ represented by $T_{b11}$, $T_{b21}$, $T_{b12}$ and $T_{b22}$, the pre-charge circuits (functioning as a pre-charging means) $PR_n$ represented by $PR_1$ and $PR_2$; the pre-charge control signal line 6, the column selector 9 (functioning as a detecting means), the sense amplifier 10 (functioning as the detecting means), the output control circuit 11 (functioning as the detecting means), and the data bus 12.

In addition to the above configuration, symbols $SL_n$ denote a plurality of data-output-bit selection signal lines. Each of the data-output-bit selection signal lines $SL_n$ transmits a data-output-bit selection signal indicating the selection of memory cells $M_{mn}$ arranged in one column. Symbols $T_{cmn}$ denote a plurality of third n-channel transistors (functioning as a gate control means). The gate electrodes of the third n-channel transistors $T_{cmn}$ are connected with the corresponding data-output-bit selection signal lines $SL_n$. Each of the third n-channel transistors $T_{cmn}$ sends a row selection signal transmitted through one word line $WL_m$ to the first n-channel transistor $T_{amn}$ and the second n-channel transistor $T_{bmn}$ in cases where the data-output-bit selection signal transmitting through the data-output-bit selection signal line $SL_n$ is received in the gate electrode. Symbols $SWL_{mn}$ denote a plurality of sub-word lines (functioning as the gate means). Each of the sub-word lines $SWL_{mn}$ connects one third n-channel transistor $T_{cmn}$ with one first n-channel transistor $T_{amn}$ and one second n-channel transistor $T_{bmn}$, and transmits the row selection signal transmitting through the third n-channel transistor $T_{cmn}$ to the gate electrode of the first n-channel transistor $T_{amn}$ and the gate electrode of the second n-channel transistor $T_{bmn}$ to turn on the first n-channel transistor $T_{amn}$ and the second n-channel transistor $T_{bmn}$.

The address latch (functioning as an address holding means) 7 receives an address signal, which indicates an address (i, j) of a particular memory cell $M_{ij}$ to be accessed, from a central processing unit (not shown) or the like and holds address data indicating a particular row (that is, the i-th row) and a particular column (that is, the j-th column) as the address (i,j) of the particular memory cell $M_{ij}$.

The row decoder (functioning as a row specifying means) 8 decodes the address data of the particular memory cell $M_{ij}$ held in the address latch 7 to specify the particular row and heightens the electric level of a particular word line $W_i$ corresponding to the particular row of the particular memory cell $M_{ij}$ to the "H" level in the reading operation to turn on the first n-channel transistor $T_{a11}$ and the second n-channel transistor $T_{bij}$ corresponding to the particular memory cell $M_{ij}$ and to equalize the electric levels of a particular pair of bit lines $BL_j$ and $BL_j'$ with those of the sides of the particular memory cell $M_{ij}$. A numeral number 13 denotes a column decoder (functioning as an access column selecting means). The column decoder 13 decodes the address data of the particular memory cell $M_{ij}$ held in the address latch 7 to specify the particular column corresponding to the particular memory cell $M_{ij}$ and outputs a data-output-bit selection signal indicating the selection of memory cells $M_{mj}$ arranged in the particular column to the data-output-bit selection signal line $SL_j$ to turn on the first, second and third n-channel transistors $T_{aij}$, $T_{bij}$ and $T_{cij}$ and to electrically connect a pair of particular first and second bit lines $BL_j$ and $BL_j'$ with the particular memory cell $M_{ij}$.

In the above configuration, an operation of the semiconductor random access memory is described.

In cases where the "H" data (or "L" data) stored in the memory cell $M_{ij}$ ($1 \leq i \leq M$, and $1 \leq j \leq N$) is readout in a cycle, a pre-charge operation is performed in the first half of the cycle by using the pre-charge circuits $PR_n$ to set all bit lines $BL_n$ and $BL_n'$ to the "H" level. Thereafter, in the second half of the cycle, address data, which indicates an address (i, j) of the memory cell $M_{ij}$ and is held in the address latch 7, is decoded in the row decoder 8, the word line $WL_i$ corresponding to the particular row of the memory cell $M_{ij}$ is selected according to the decoded data in the row decoder 8, and the word line $WL_i$ is set to the "H" level by the row decoder 8 to transmit a row selection signal to the third n-channel transistors $T_{cin}$ corresponding to the memory cells $M_{in}$ of the i-th row. Also, the particular column (j-th column) of the memory cell $M_{ij}$ is specified in the column decoder 13, and a data-output-bit selection signal of the "H" level indicating the selection of memory cells $M_{mj}$ arranged in the particular column is transmitted to each of the gain electrodes of the third n-channel transistors $T_{cmj}$ corresponding to the memory cells $M_{mj}$ of the j-th column through the data-output-bit selection signal line $SL_j$. Because the third n-channel transistors $T_{cmj}$ of the j-th column are turned on and because the row selection signal is transmitted to the third n-channel transistors $T_{cin}$ of the i-th row, only the row selection signal transmitted to the third n-channel transistor $T_{cij}$ of the i-th row and the j-th column passes through the third n-channel transistor $T_{cij}$ and is sent to the gate electrodes of the first and second n-channel transistors $T_{aij}$ and $T_{bij}$ through the sub-word line $SWL_{ij}$. Therefore, only the first and second n-channel transistors $T_{aij}$ and $T_{bij}$ are turned on to equalize the electric level of the bit line $BL_j$ with that of the first side of the memory cell $M_{ij}$ and to equalize the electric level of the bit line $BL_j'$ with that of the second side of the memory cell $M_{ij}$. Therefore, because the "H" data (or "L" data) is stored in the memory cell $M_{ij}$, the electric level of the bit line $BL_j'$ (or $BL_j$) is lowered to the "L" level, and the bit line $BL_j$ (or $BL_j'$) is maintained to the "H" level. In this case, the bit lines $BL_n$ and $BL_n'$ except for the bit line $BL_j'$ (or $BL_j$) are maintained to the "H" level because the third n-channel transistors $T_{cmn}$ except for the third n-channel transistor $T_{cij}$ are maintained to a turn-off condition.

Thereafter, the pair of bit lines $BL_j$ and $BL_j'$ electrically connected with the memory cell $M_{ij}$ are selected by the column selector 9 according to the address data held in the address latch 7, and the pair of bit lines $BL_j$ and $BL_j'$ are connected with the sense amplifier 10. In the sense amplifier 10, an electric potential difference of the bit line $BL_j$ from the bit line $BL_j'$ is detected and amplified. In cases where the electric level of the bit line $BL_j$ is higher than that of the bit line $BL_j'$, a data signal set to a particular electric level corresponding to the "H" data is produced according to the electric potential difference and is output to the data bus 12 through the output control circuit 11 as a signal indicating the "H" data stored in the memory cell $M_{11}$. Also, in cases where the electric level of the bit line $BL_j$ is lower than that of the bit line $BL_j'$, a data signal set to a particular electric level corresponding to the "L" data is produced according to the electric potential difference and is output to the data bus 12 through the output control circuit 11 as a signal indicating the "L" data stored in the memory cell $M_{11}$. Therefore, the "H" data (or "L" data) stored in the memory cell $M_{ij}$ can be read out to an outer apparatus.

An example of the operation is described with reference to FIG. 2.

Figure 2:
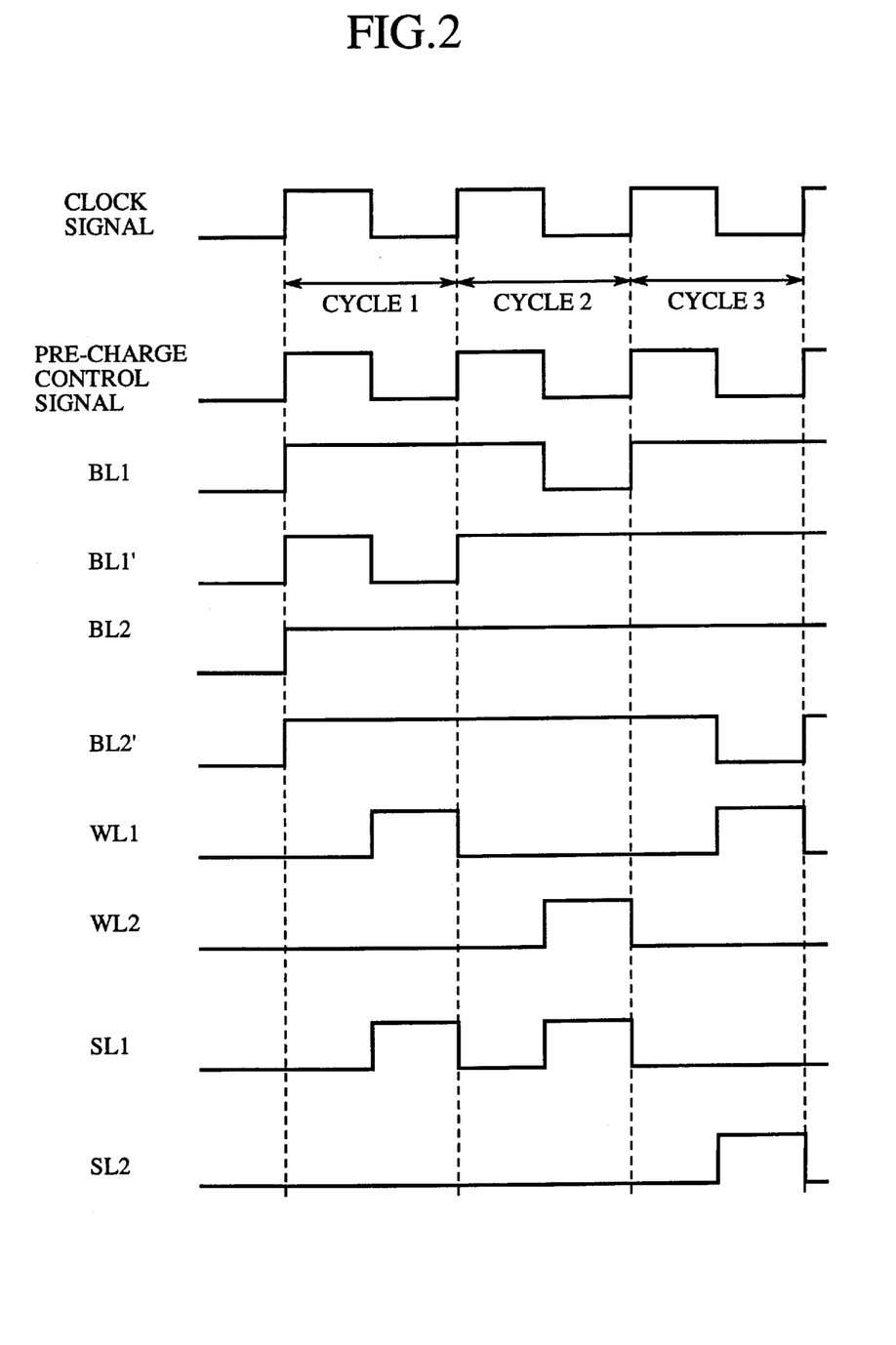
FIG. 2 shows the relationship of electric levels ("H" and "L" levels) of a plurality of signals and lines of the semiconductor random access memory shown in FIG. 1 in cases where data of the memory cells $M_{11}$, $M_{21}$ and $M_{12}$ are read out in that order.

FIG. 2 shows the relationship of electric levels ("H" and "L" levels) of a plurality of signals and lines of the semiconductor random access memory in cases where data stored in the memory cells $M_{11}$, $M_{21}$ and $M_{12}$ are read out in that order.

In this example, the "H" data stored in the memory cell $M_{11}$ is read out in a first cycle, the "L" data stored in the memory cell $M_{21}$ is read out in a second cycle, and the "H" data stored in the memory cell $M_{12}$ is read out in a third cycle.

In detail, after a pre-charge operation for all bit lines $BL_n$ and $BL_n'$ in the first half of the first cycle, the word line WL1 and the data-output-bit selection signal line SL1 are selected and are set to the "H" level in the second half of the first cycle. Therefore, the third n-channel transistor $T_{c11}$ is only turned on, the first and second n-channel transistors $T_{a11}$ and $T_{b11}$ are turned on, and only the electric level of the bit line $BL_1'$ is lowered to the "L" level because the "H" data is stored in the memory cell $M_{11}$. Therefore, the "H" data of the memory cell $M_{11}$ is read out. In this case, the bit lines $BL_n$ and $BL_n'$ except for the bit line $BL_1'$ are maintained to the "H" level.

Thereafter, in the first half of the second cycle, the pre-charge operation is again performed to charge only the bit line $BL_1'$. Thereafter, in the second half of the second cycle, the word line WL2 and the data-output-bit selection signal line SL1 are selected and are set to the "H" level. Therefore, the third n-channel transistor $T_{c21}$ is only turned on, the first and second n-channel transistors $T_{a21}$ and $T_{b21}$ are turned on, and only the electric level of the bit line $BL_1$ is lowered to the "L" level because the "L" data is stored in the memory cell $M_{21}$. Therefore, the "L" data of the memory cell $M_{21}$ is read out. In this case, the bit lines $BL_n$ and $BL_n'$ except for the bit line $BL_1$ are maintained to the "H" level.

Thereafter, in the first half of the third cycle, the pre-charge operation is again performed to charge only the bit line $BL_1$. Thereafter, in the second half of the third cycle, the word line WL1 and the data-output-bit selection signal line SL2 are selected and are set to the "H" level. Therefore, the third n-channel transistor $T_{c12}$ is only turned on, the first and second n-channel transistors $T_{a12}$ and $T_{b12}$ are turned on, and only the electric level of the bit line $BL_2'$ is lowered to the "L" level because the "H" data is stored in the memory cell $M_{12}$. Therefore, the "H" data of the memory cell $M_{12}$ is read out. In this case, the bit lines $BL_n$ and $BL_n'$ except for the bit line $BL_2'$ are maintained to the "H" level.

Accordingly, because the row number and the column number of one memory cell to be accessed are specified by selecting one word line and one data-output-bit selection signal line, the memory cell to be accessed is specified by using the third n-channel transistors $T_{cmn}$, and a charge of only one bit line corresponding to the memory cell is discharged to the memory cell. Therefore, an electric power consumed in each pre-charge operation can suppressed, so that the electric power can be stably supplied to the bit lines.

Embodiment 2

In this embodiment, only one pair of bit lines corresponding to one memory cell to be accessed are pre-charged before data is read out from the memory cell.

Figure 3:
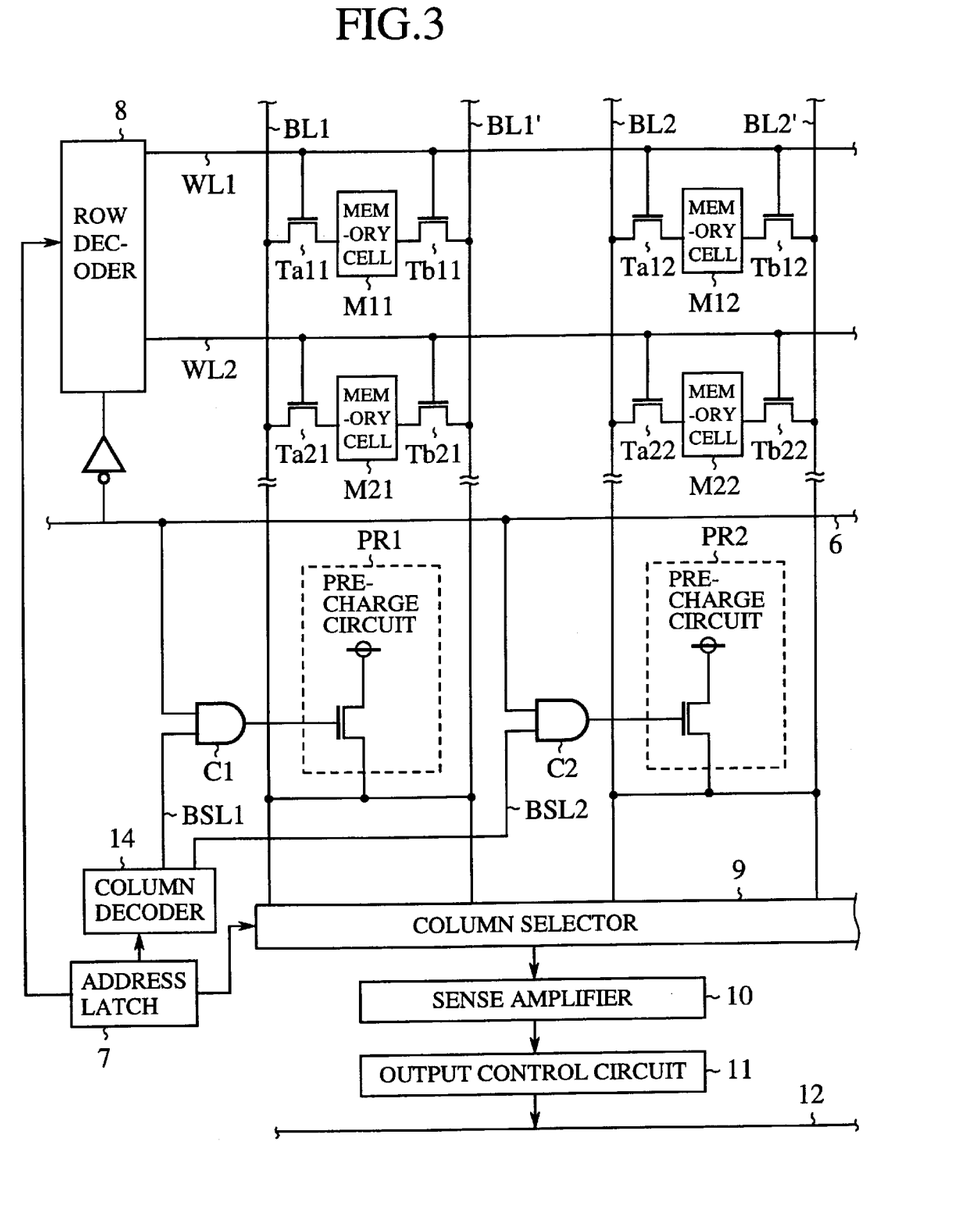
FIG. 3 is a circuit view showing a configuration of a semiconductor random access memory according to a second embodiment of the present invention.

FIG. 3 is a circuit view showing a configuration of a semiconductor random access memory according to a second embodiment of the present invention. The detail description of composing elements indicated by reference numerals, which are the same as those used in FIG. 6, is omitted because the composing elements of FIG. 3 are the same as or equivalent to those of FIG. 6 indicated by the same reference numerals.

As shown in FIG. 3, a semiconductor random access memory comprises the memory cells $M_{mn}$ represented by the memory cells $M_{11}$, $M_{12}$, $M_{21}$ and $M_{22}$, the plurality of pairs of bit lines $BL_n$ and $BL_n'$ represented by the pair of bit lines BL1 and BL1' and the pair of bit lines BL2 and BL2', the word lines $WL_m$ represented by WL1 and WL2, the first n-channel transistors (functioning as a gate means) $T_{amn}$ represented by $T_{a11}$, $T_{a21}$, $T_{a12}$ and $T_{a22}$, the second n-channel transistors (functioning as the gate means) $T_{bmn}$ represented by $T_{b11}$, $T_{b21}$, $T_{b12}$ and $T_{b22}$, the pre-charge circuits (functioning as a pre-charging means) $PR_n$ represented by PR1 and PR2, the pre-charge control signal line 6, the address latch (functioning as an address holding means) 7, the row decoder (functioning as a row specifying means) 8, the column selector 9 (functioning as a detecting means), the sense amplifier 10(functioning as the detecting means), the output control circuit 11(functioning as the detecting means) and the data bus 12.

In addition to the above configuration, symbols $BSL_n$ denotes a plurality of pre-charge bit selection signal lines (functioning as the pre-charging means). Each of the pre-charge bit selection signal lines $BSL_n$ transmits a pre-charge bit selection signal to perform the pre-charge operation for the corresponding pair of bit lines $BL_n$ and $BL_n'$. Symbols $C_n$ denote a plurality of AND circuits (functioning as the pre-charging means). A first input terminal of each AND circuit $C_n$ is connected with the pre-charge control signal line 6, a second input terminal of each AND circuit $C_n$ is connected with the corresponding pre-charge bit selection signal line $BSL_n$ and an output terminal of each AND circuit $C_n$ is connected with the corresponding pre-charge circuit $PR_n$. Each AND circuit $C_n$ outputs a pre-charge performing signal to the corresponding pre-charge circuit $PR_n$ to perform the pre-charge operation for the pair of bit lines $BL_n$ and $BL_n'$ in cases where both the pre-charge control signal transmitting through the pre-charge control signal line 6 and the pre-charge bit selection signal transmitting through the pre-charge bit selection signal line $BSL_n$ are input to the AND circuit $C_n$.

A numeral number 14 denotes a column decoder (functioning as a pre-charge column selecting means). The column decoder 14 selects one pair of particular first and second bit lines $BL_j$ and $BL_j'$ according to the address data held in the address latch 7 and transmits a pre-charge bit selection signal to the AND circuit $C_j$ through the pre-charge bit selection signal line $BSL_j$ corresponding to the selected pair of particular first and second bit lines $BL_j$ and $BL_j'$ to make the pre-charging circuit $PR_j$ supply charges to the pair of particular first and second bit lines $BL_j$ and $BL_j'$.

In the above configuration, an operation of the semiconductor random access memory is described.

In cases where the "H" data (or "L" data) stored in the memory cell $M_{ij}$ ($1 \leq i \leq M$, and $1 \leq j \leq N$) is readout in a cycle, In the first half of the cycle, the pre-charge control signal set to the "H" level is transmitted to all AND circuits $C_n$ through the pre-charge control signal line 6. Also, the pair of bit lines $BL_j$ and $BL_j'$ corresponding to the memory cell $M_{ij}$ are selected in the column decoder 14 according to address data which indicates an address (i, j) of the memory cell $M_{ij}$ and is held in the address latch 7, and the pre-charge bit selection signal line $BSL_j$ corresponding to the selected pair of bit lines $BL_j$ and $BL_j'$ is set to the "H" level in the column decoder 14. Therefore, a pre-charge bit selection signal is sent to the AND circuit $C_j$ through the pre-charge bit selection signal line $BSL_j$. Because the pre-charge bit selection signal and the pre-charge control signal are input to the AND circuit $C_j$, a pre-charge performing signal is output from the AND circuit $C_j$ to the pre-charge circuit $PR_j$, so that the pre-charge operation is performed for the pair of bit lines $BL_j$ and $BL_j'$ corresponding to the pre-charge circuit $PR_j$. Therefore, the electric levels of the pair of bit lines $BL_j$ and $BL_j'$ are set to the "H" level. In this case, the bit lines $BL_n$ and $BL_n'$ except for the pair of bit lines $BL_j$ and $BL_j'$ are maintained to the "L" level. Thereafter, in the second half of the cycle, the address data held in the address latch 7 is decoded in the row decoder 8, the word line $WL_i$ corresponding to the memory cell $M_{ij}$ is selected according to the decoded data in the row decoder 8, and the electric level of the word line $WL_i$ is heightened to the "H" level by the row decoder 8 to transmit a row selection signal to the gate electrodes of the first and second n-channel transistors $T_{ain}$ and $T_{bin}$ corresponding to the memory cells $M_{in}$ of the i-th row. Therefore, the first and second n-channel transistors $T_{ain}$ and $T_{bin}$ are turned on to electrically connect the bit lines $BL_n$ and $BL_n'$ with the memory cells $M_{in}$, and the electric level of the bit line $BL_j'$ (or bit line $BL_j$) is lowered to the "L" level because the "H" data (or "L" data) is stored in the memory cell $M_{ij}$. In contrast, because the bit lines $BL_n$ and $BL_n'$ except for the pair of bit lines $BL_j$ and $BL_j'$ are maintained to the "L" level, even though the bit lines $BL_n$ and $BL_n'$ are electrically connected with the memory cells $M_{in}$, the electric levels of the bit lines $BL_n$ and $BL_n'$ except for the pair of bit lines $BL_j$ and $BL_j'$ are still maintained to the "L" level.

Thereafter, the pair of bit lines $BL_j$ and $BL_j'$ are connected with the sense amplifier 10, and a data signal indicating the "H" data (or "L" data) stored in the memory cell $M_{ij}$ is output to the data bus 12 through the output control circuit 11 in the same manner as in the first embodiment. Therefore, the "H" data (or "L" data) stored in the memory cell $M_{ij}$ can be read out to an outer apparatus.

An example of the operation is described with reference to FIG. 4.

Figure 4:
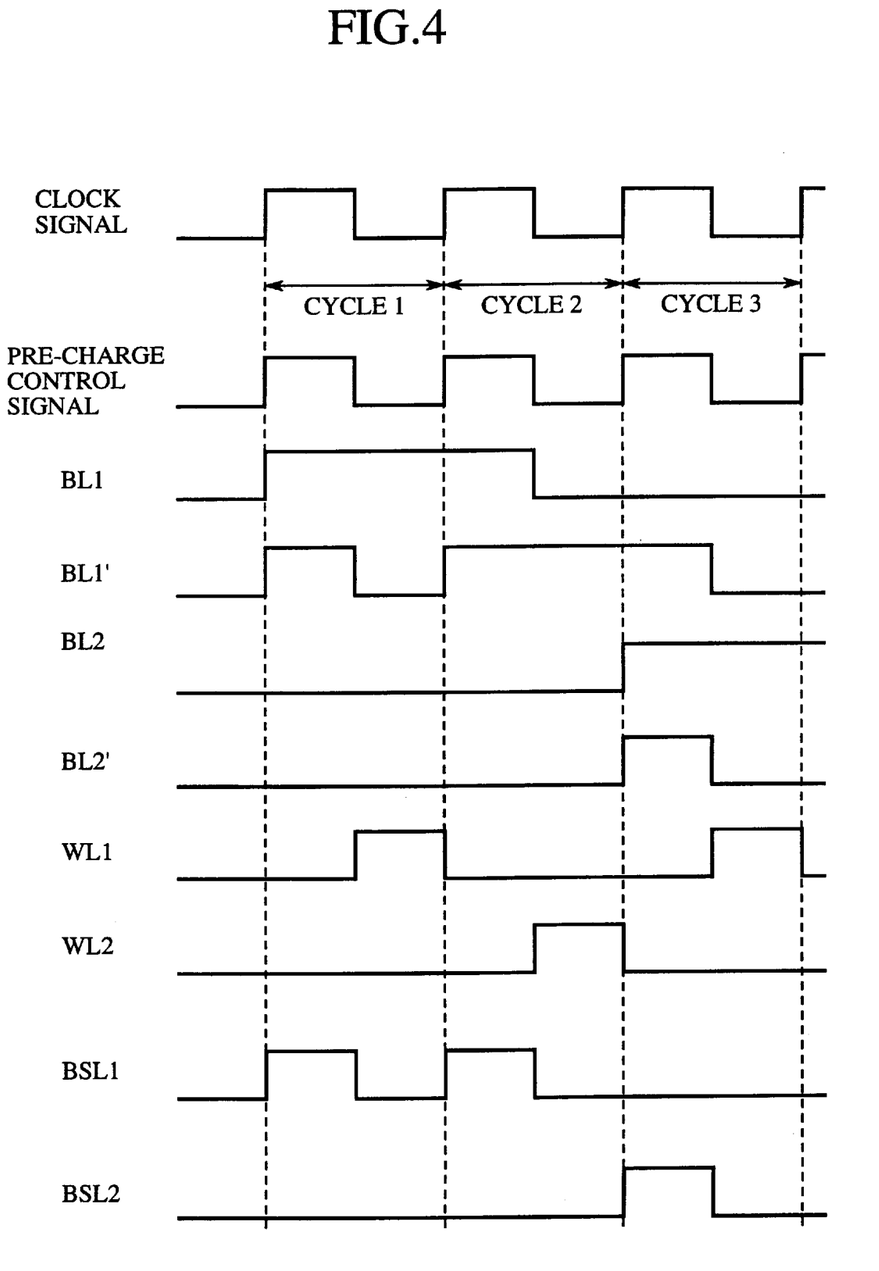
FIG. 4 shows the relationship of electric levels ("H" and "L" levels) of a plurality of signals and lines of the semiconductor random access memory shown in FIG. 3 in cases where data stored in the memory cells $M_{11}$, $M_{21}$ and $M_{12}$ are read out in that order.

FIG. 4 shows the relationship of electric levels ("H" and "L" levels) of a plurality of signals and lines of the semiconductor random access memory in cases where data stored in the memory cells $M_{11}$, $M_{21}$ and $M_{12}$ are read out in that order.

In this example, the "H" data stored in the memory cell $M_{11}$ is read out in a first cycle, the "L" data stored in the memory cell $M_{21}$ is read out in a second cycle, and the "H" data stored in the memory cell $M_{12}$ is read out in a third cycle.

In detail, in the first half of the first cycle, the pair of bit lines $BL_1$ and $BL_1'$ corresponding to the memory cell $M_{11}$ are selected according to address data indicating an address (1, 1) of the memory cell $M_{11}$, the pre-charge bit selection signal line $BSL_1$ corresponding to the selected pair of bit lines $BL_1$ and $BL_1'$ is set to the "H" level to send a pre-charge bit selection signal to the AND circuit $C_1$ through the pre-charge bit selection signal line $BSL_1$, a pre-charge performing signal is output from the AND circuit $C_1$ to the pre-charge circuit $PR_1$, and a pre-charge operation is performed by the pre-charge circuit $PR_1$ for the pair of bit lines $BL_1$ and $BL_1'$. Therefore, the electric levels of the pair of bit lines $BL_1$ and $BL_1'$ are set to the "H" level. In contrast, the bit lines $BL_n$ and $BL_n'$ except for the pair of bit lines $BL_1$ and $BL_1'$ are maintained to the "L" level.

Thereafter, in the second half of the first cycle, a row selection signal is transmitted through the word line $WL_1$ corresponding to the memory cell $M_{11}$, and the bit lines $BL_n$ and $BL_n'$ are electrically connected with the memory cells $M_{1n}$ of the first row in the same manner as in the conventional semiconductor random access memory shown in FIG. 6. Therefore, the electric level of the bit line $BL_1'$ is lowered to the "L" level because the "H" data is stored in the memory cell $M_{11}$, and the bit line $BL_1$ is maintained to the "H" level. In this case, the bit lines $BL_n$ and $BL_n'$ except for the pair of bit lines $BL_1$ and $BL_1'$ are maintained to the "L" level. Thereafter, a data signal indicating the "H" data stored in the memory cell $M_{11}$ is output from the sense amplifier 10 to the data bus 12 through the output control circuit 11.

Thereafter, in the first half of the second cycle, a pre-charge operation is performed by the pre-charge circuit $PR_1$ for the pair of bit lines $BL_1$ and $BL_1'$ according to address data indicating an address (2, 1) of the memory cell $M_{21}$ in the same manner as in the first half of the first cycle, the electric levels of the pair of bit lines $BL_1$ and $BL_1'$ are set to the "H" level. Because the bit line $BL_1$ is maintained to the "H" level in the first cycle, a pre-charge is performed only for the bit line $BL_1'$. Also, the bit lines $BL_n$ and $BL_n'$ except for the pair of bit lines $BL_1$ and $BL_1'$ are maintained to the "L" level.

Thereafter, in the second half of the second cycle, a row selection signal is transmitted through the word line $WL_2$ corresponding to the memory cell $M_{21}$, and the bit lines $BL_n$ and $BL_n'$ are electrically connected with the memory cells $M_{2n}$ of the second row in the same manner as in the conventional semiconductor random access memory shown in FIG. 6. Therefore, the electric level of the bit line $BL_1$ is lowered to the "L" level because the "L" data is stored in the memory cell $M_{21}$, and the bit line $BL_1'$ is maintained to the "H" level. In this case, the bit lines $BL_n$ and $BL_n'$ except for the pair of bit lines $BL_1$ and $BL_1'$ are maintained to the "L" level. Thereafter, a data signal indicating the "L" data stored in the memory cell $M_{21}$ is output from the sense amplifier 10 to the data bus 12 through the output control circuit 11.

Thereafter, in the first half of the third cycle, the pair of bit lines $BL_2$ and $BL_2'$ corresponding to the memory cell $M_{12}$ are selected according to address data indicating an address (1, 2) of the memory cell $M_{12}$, the pre-charge bit selection signal line $BSL_2$ corresponding to the selected pair of bit lines $BL_2$ and $BL_2'$ is set to the "H" level to send a pre-charge bit selection signal to the AND circuit $C_2$ through the pre-charge bit selection signal line $BS_2$, a pre-charge performing signal is output from the AND circuit $C_2$ to the pre-charge circuit $PR_2$, and a pre-charge operation is performed by the pre-charge circuit $PR_2$ for the pair of bit lines $BL_2$ and $BL_2'$. Therefore, the electric levels of the pair of bit lines $BL_2$ and $BL_2'$ are set to the "H" level. In contrast, the bit line $BL_1'$ heightened to the "H" level in the second cycle is maintained to the "H" level, and the bit lines $BL_n$ and $BL_n'$ except for the pair of bit lines $BL_2$ and $BL_2'$ and the bit line $BL_1'$ are maintained to the "L" level.

Thereafter, in the second half of the third cycle, a row selection signal is transmitted through the word line $WL_1$ corresponding to the memory cell $M_{12}$, and the bit lines $BL_n$ and $BL_n'$ are electrically connected with the memory cells $M_{1n}$ of the first row in the same manner as in the first cycle. Therefore, because the "H" data is stored in the memory cell $M_{12}$, the electric level of the bit line $BL_2'$ is lowered to the "L" level, and the bit line $BL_1$ is maintained to the "H" level. In this case, because the "H" data is stored in the memory cell M11, the electric level of the bit line BL1 38 set to the "H" level in the second cycle is lowered to the "L" level. Also, the bit lines BLn and BLn' except for the pair of bit lines BL2 and BL2' and the bit line BL1' are maintained to the "L" level. Thereafter, a data signal indicating the "H" data stored in the memory cell M12 is output from the sense amplifier 10 to the data bus 12 through the output control circuit 11.

Accordingly, because the pre-charge circuit PRj corresponding to one memory cell Mij to be accessed is only operated to pre-charge only the pair of bit lines BLj and BLj' corresponding to the memory cell Mij, even though the first and second n-channel transistors Tain and Tbin of the i-th row are turned on according to a row selection signal transmitting through the word line WLi, the charge of one of the bit line BLj or BLj' pre-charged is only discharged, but the charge of the other bit lines is not discharged. Therefore, an electric power consumed in this semiconductor random access memory can be suppressed, so that the electric power can be stably supplied to the semiconductor random access memory.

In the example of this embodiment, in cases where the "H" data stored in the memory cell M12 is read out in the third cycle, because the bit line BL1' not corresponding to the memory cell M12 is set to the "H" level in the second cycle, the electric level of the bit line BL1' is lowered to the "L" level in the third cycle. Therefore, not only the charge of the bit line BL2' but also the charge of the bit line BL1' are consumed in the third cycle.

Figure 5:
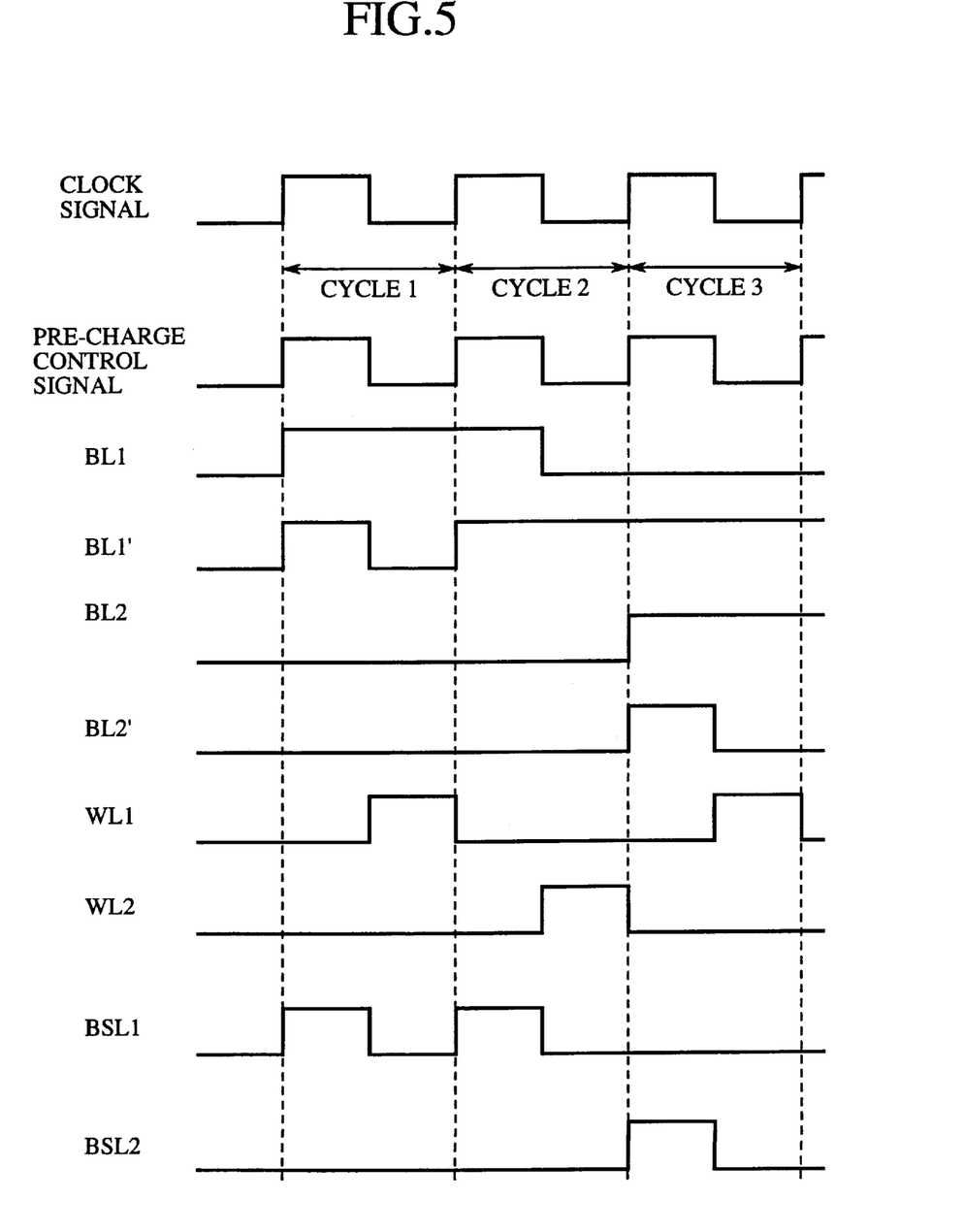
FIG. 5 shows the relationship of electric levels ("H" and "L" levels) of a plurality of signals and lines of the semiconductor random access memory shown in FIG. 3 according to a modification of the second embodiment.

To prevent the discharge of one or more bit lines not corresponding to one memory cell to be accessed, it is preferred that the data-output-bit selection signal lines SLn, th-e third n-channel transistors Tcmn and the sub-word lines SWLmn used in the first embodiment be additionally arranged in the semiconductor random access memory of the second embodiment. In this case, because no sets of first and second n-channel transistors Tamn and Tbmn corresponding to a plurality of pairs of bit lines other than one pair of bit lines corresponding to one memory cell to be accessed are turned on, there is no probability that the charge of one or more bit lines not corresponding to one memory cell to be accessed is discharged. In this case, the relationship of electric levels ("H" and "L" levels) of a plurality of signals and lines is shown in FIG. 5.

Therefore, an electric power consumed in this semiconductor random access memory can be moreover suppressed.

For example, in cases where the "H" data stored in the memory cell M12 is read out in the third cycle on condition that the electric level of the bit line BL1' set to the "H" level in the second cycle is maintained, a pre-charge control signal and a pre-charge bit selection signal are sent to the AND circuit C2 in the first half of the third cycle to pre-charge only the pair of bit lines BL2 and BL2'. Thereafter, in the second half of the third cycle, the word line WL1 and the data-output-bit selection signal SL2 are set to the "H" level to electrically connect the pair of bit lines BL2 and BL2' with the memory cell M12. Therefore, because no memory cell is electrically connected with the bit line BL1', as shown in FIG. 5, the electric level of the bit line BL1' is maintained to the "H" level, and only the electric level of the bit line BL2' is lowered to the "L" level.

What is claimed is:

1. A semiconductor random access memory comprising:
a plurality of word lines extending in a horizontal direction;
a plurality of pairs of first and second bit lines extending in a vertical direction, each pair of first and second bit lines adjacent to each other respectively having one of two electric levels opposite to each other;

a plurality of memory cells arranged in a matrix shape, each memory cell being arranged in a space partitioned by one pair of first and second bit lines and one word line, a first side and a second side of each memory cell being set to the electric levels opposite to each other;

a first transistor arranged for each memory cell, each first transistor being connected with the first bit line of the corresponding pair of first and second bit lines and the first side of the corresponding memory cell;

a second transistor arranged for each memory cell, each second transistor being connected with the second bit line of the corresponding pair of first and second bit lines and the second side of the corresponding memory cell;

a sub-word line arranged for each memory cell, each sub-word line connecting a gate of the corresponding first transistor and a gate of the corresponding second transistor;

a third transistor arranged for each memory cell, each third transistor connecting the corresponding word line and the corresponding sub-word line; and a data-output-bit selection signal line arranged for each pair of first and second bit lines, each data-output-bit selection signal line being connected with gates of all third transistors which correspond to all memory cells connected with the corresponding pair of first and second bit lines.

2. A semiconductor random access memory comprising:
a plurality of word lines extending in a horizontal direction;

a plurality of pairs of first and second bit lines extending in a vertical direction, each pair of first and second bit lines adjacent to each other respectively having one of two electric levels opposite to each other;

a pre-charge control signal line extending in the same direction as that of the word line;

a pre-charge circuit, arranged for each pair of first and second bit lines and connected with the pair of first and second bit lines, for performing a pre-charge of the pair of first and second bit lines;

a pre-charge bit selection signal line, arranged for each pair of first and second bit lines, for transmitting a bit selection signal instructing the pre-charge of the corresponding pair of first and second bit lines; and an AND gate arranged for each pair of first and second bit lines, an input side of each AND gate being connected with the pre-charge control signal line and one pre-charge bit selection signal line relating to the corresponding pair of first and second bit lines, and an output side of each AND gate being connected with the pre-charge circuit relating to the corresponding pair of first and second bit lines.

3. A semiconductor random access memory according to claim 1, further comprising:
a pre-charge control signal line extending in the same direction as that of the word line;

a pre-charge circuit, arranged for each pair of first and second bit lines and connected with the pair of first and second bit lines, for performing a pre-charge of the pair of first and second bit lines;

a pre-charge bit selection signal line, arranged for each pair of first and second bit lines, for transmitting a bit selection signal instructing the pre-charge of the corresponding pair of first and second bit lines; and an AND gate arranged for each pair of first and second bit lines, an input side of each AND gate being connected with the pre-charge control signal line and one pre-charge bit selection signal line relating to the corresponding pair of first and second bit lines, and an output side of each AND gate being connected with the pre-charge circuit relating to the corresponding pair of first and second bit lines.

* * * * *